US010825682B2

(12) United States Patent
Chan et al.

(10) Patent No.: US 10,825,682 B2
(45) Date of Patent: Nov. 3, 2020

(54) METHOD FOR PRODUCING A PILLAR STRUCTURE IN A SEMICONDUCTOR LAYER

(71) Applicant: IMEC VZW, Leuven (BE)

(72) Inventors: Boon Teik Chan, Leuven (BE); Vasile Paraschiv, Kessel-lo (BE); Efrain Altamirano Sanchez, Kessel-lo (BE); Zheng Tao, Leuven (BE)

(73) Assignee: IMEC VZW, Leuven (BE)

(*) Notice: Subject to any disclaimer, the term of this patent is extended or adjusted under 35 U.S.C. 154(b) by 624 days.

(21) Appl. No.: 15/258,838

(22) Filed: Sep. 7, 2016

(65) Prior Publication Data
US 2017/0103889 A1 Apr. 13, 2017

(30) Foreign Application Priority Data
Oct. 8, 2015 (EP) .................. 15188985

(51) Int. Cl.
H01L 21/3065 (2006.01)
H01L 21/308 (2006.01)
(Continued)

(52) U.S. Cl.
CPC ........ H01L 21/02603 (2013.01); B82Y 10/00 (2013.01); B82Y 40/00 (2013.01);
(Continued)

(58) Field of Classification Search
CPC .................................................. H01L 21/3083
See application file for complete search history.

(56) References Cited

U.S. PATENT DOCUMENTS 4,729,815 A * 3/1988 Leung ............... H01L 21/3065
257/E21.218
5,780,327 A * 7/1998 Chu .................. H01L 29/66666
257/E21.41

(Continued)

FOREIGN PATENT DOCUMENTS

WO 2014/074943 A1 5/2014
WO 2014/169383 A1 10/2014

OTHER PUBLICATIONS

Gay, G. et al., "CMOS Compatible Strategy Based on Selective Atomic Layer Deposition of a Hard Mask for Transferring Block Copolymer Lithography Patterns", Nanotechnology, vol. 21, 2010, pp. 1-7.

(Continued)

Primary Examiner — Omar F Mojaddedi
(74) Attorney, Agent, or Firm — McDonnell Boehnen Hulbert & Berghoff LLP

(57) ABSTRACT

A method for producing a pillar structure in a semiconductor layer, the method including providing a structure including, on a main surface, a semiconductor layer. A patterned hard mask layer stack is provided on the semiconductor layer that includes a first layer in contact with the semiconductor layer and a second layer overlying and in contact with the first layer. The semiconductor layer is etched using the patterned hard mask layer stack as a mask. The etching includes subjecting the structure to a first plasma thereby removing a first part of the semiconductor layer and at least a part of the second layer while preserving the first layer thereby, producing a first part of the pillar structure, thereafter; and subjecting the structure to a second plasma thereby removing a second part of the semiconductor layer thereby, producing a second part of the pillar structure.

20 Claims, 12 Drawing Sheets

(51) Int. Cl.
  *H01L 21/306* (2006.01)
  *H01L 21/02* (2006.01)
  *H01L 29/06* (2006.01)
  *H01L 29/66* (2006.01)
  *H01L 29/775* (2006.01)
  *B82Y 40/00* (2011.01)
  *B82Y 10/00* (2011.01)
  *H01L 21/265* (2006.01)
  *H01L 21/28* (2006.01)

(52) U.S. Cl.
  CPC ...... *H01L 21/265* (2013.01); *H01L 21/28008* (2013.01); *H01L 21/3065* (2013.01); *H01L 21/3083* (2013.01); *H01L 21/3085* (2013.01); *H01L 29/0676* (2013.01); *H01L 29/66439* (2013.01); *H01L 29/66666* (2013.01); *H01L 29/775* (2013.01)

(56) References Cited

U.S. PATENT DOCUMENTS

| | | | |
|---|---|---|---|
| 6,287,974 B1* | 9/2001 | Miller | H01L 21/3065 257/E21.218 |
| 6,583,063 B1 | 6/2003 | Khan et al. | |
| 7,531,461 B2 | 5/2009 | Ko | |
| 8,372,755 B2 | 2/2013 | Wang et al. | |
| 8,629,527 B2 | 1/2014 | Parekh et al. | |
| 8,735,252 B2 | 5/2014 | Yu et al. | |
| 2005/0101101 A1* | 5/2005 | DeLoach | H01L 21/76232 438/424 |
| 2009/0170333 A1* | 7/2009 | Sasano | H01L 21/3065 438/710 |
| 2010/0133609 A1* | 6/2010 | Gilgen | H01L 21/823481 257/330 |
| 2013/0087526 A1 | 4/2013 | Zhu et al. | |
| 2013/0187130 A1 | 7/2013 | Matus et al. | |
| 2013/0313524 A1 | 11/2013 | De Micheli et al. | |
| 2015/0048442 A1* | 2/2015 | Colinge | H01L 29/0676 257/329 |
| 2015/0053929 A1 | 2/2015 | Lee et al. | |
| 2015/0243509 A1 | 8/2015 | Chan et al. | |

OTHER PUBLICATIONS

Yang, B. et al., "Vertical Silicon-Nanowire Formation and Gate-All-Around MOSFET", IEEE Electron Device Letters, vol. 29, No. 7, Jul. 2008, pp. 791-794.

* cited by examiner

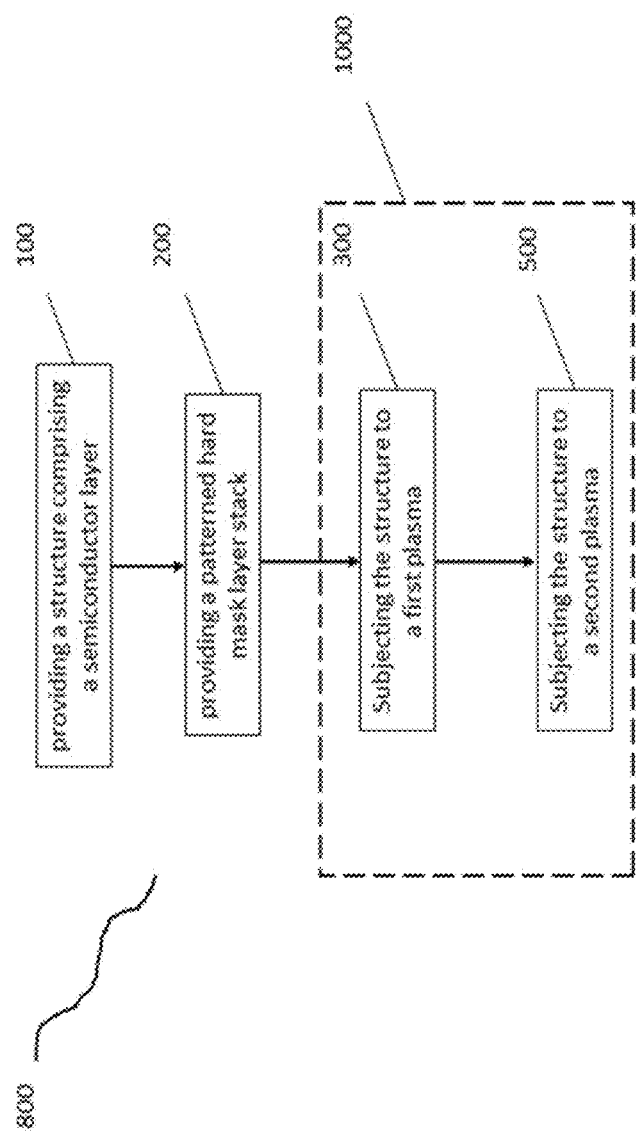

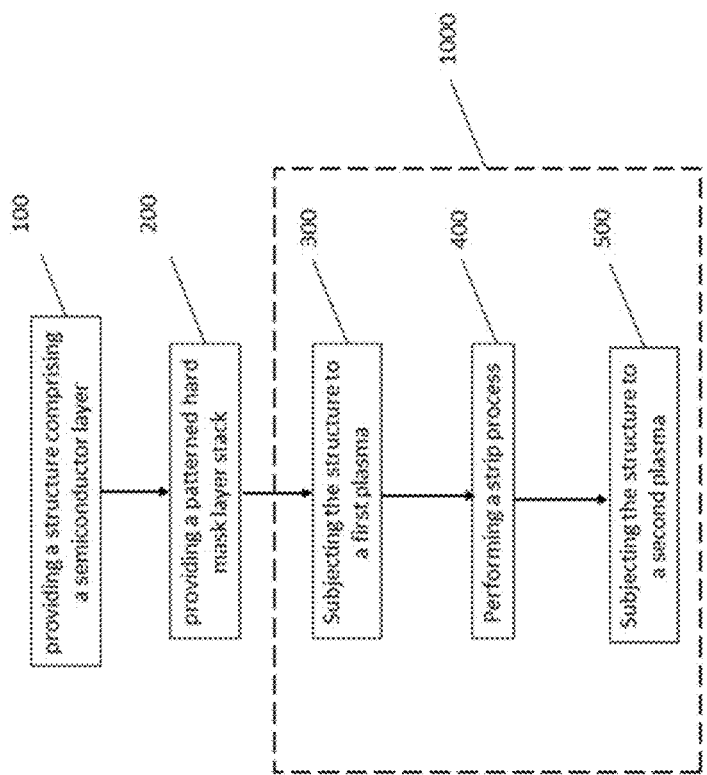

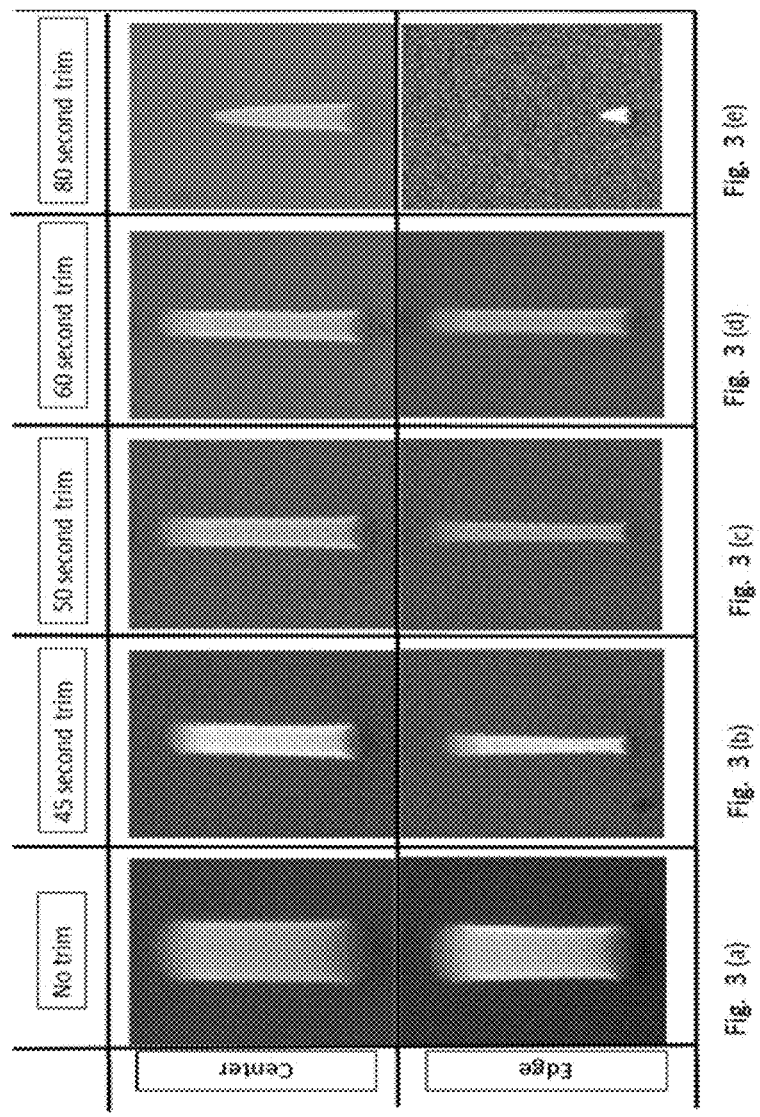

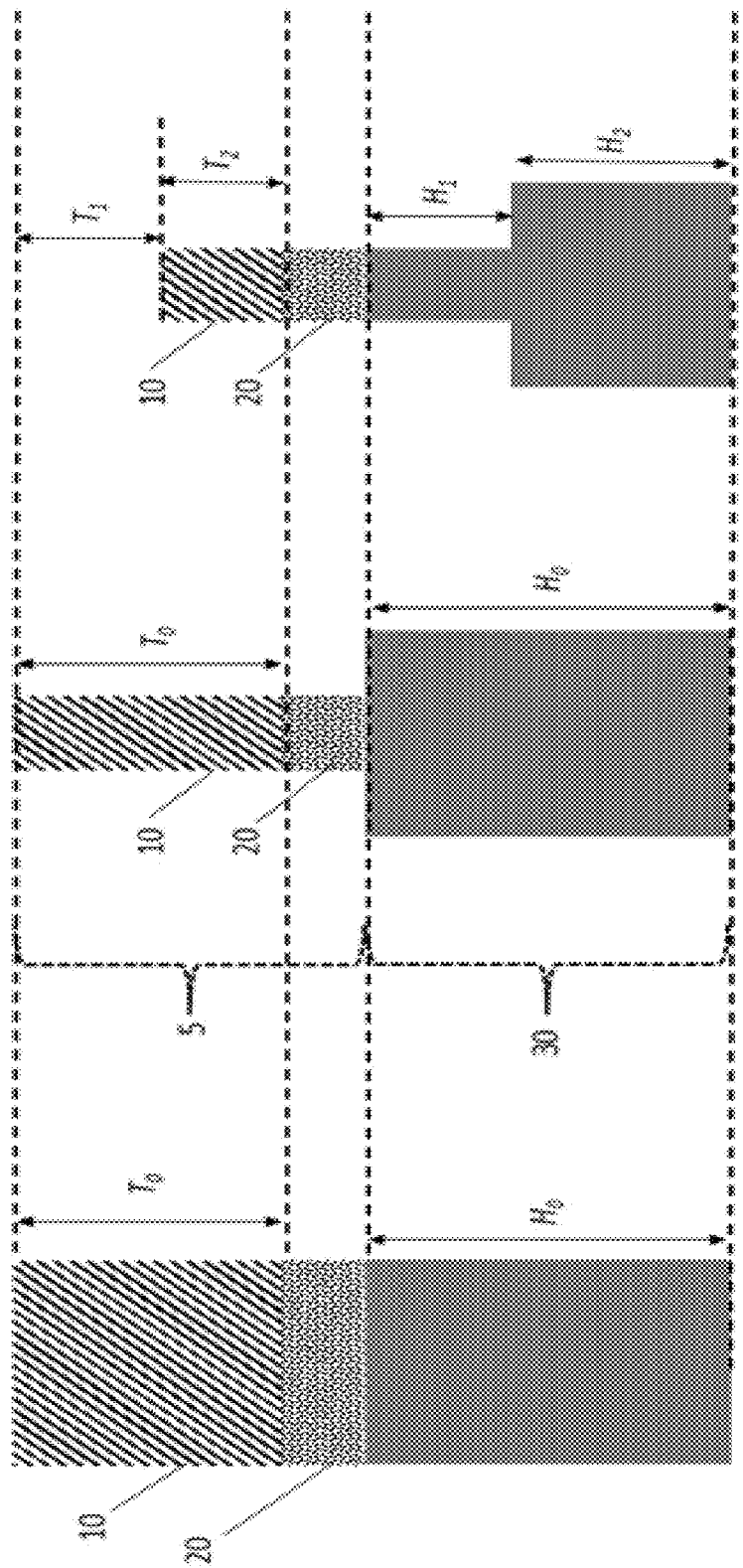

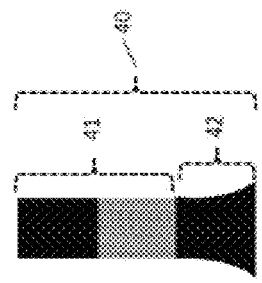
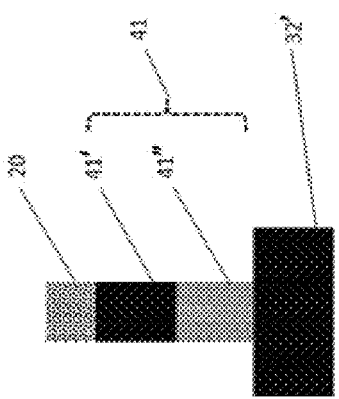

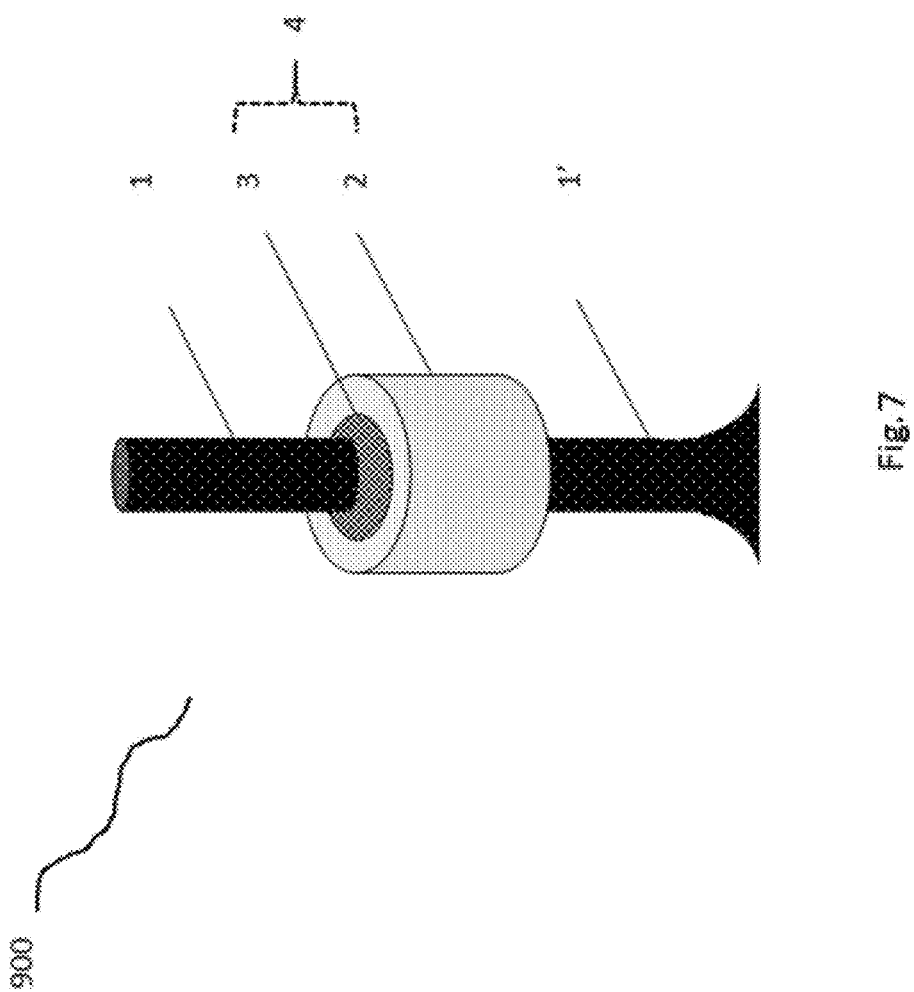

METHOD FOR PRODUCING A PILLAR STRUCTURE IN A SEMICONDUCTOR LAYER

CROSS-REFERENCE TO RELATED APPLICATIONS

The present application is a non-provisional patent application claiming priority to European Patent Application No. EP 15188985.4, filed Oct. 8, 2015, the contents of which are hereby incorporated by reference.

FIELD OF THE DISCLOSURE

The present disclosure is related to the production of semiconductor pillar structures for use in semiconductor devices. The main application is the use of semiconductor pillar structures in vertical gate-all-around nanowire field effect transistors.

BACKGROUND

The semiconductor industry has been keeping up with Moore's Law by introducing different transistor designs, whereby the size of transistors has been successively reduced. Multi-gate or tri-gate architectures, also known as FinFET technology, have been providing the required level of scalability with the desired transistor performance along with the reduction in transistor sizes. However, as the fin width of a FinFET approaches 5 nm, channel width variations have the potential to cause undesirable variability and mobility loss. In order to overcome such a problem, a new transistor candidate, which is a gate-all-around (GAA) FET may provide the solution. In a GAA-FET device, the gate is placed surrounding all sides of the channel. A GAA-FET device may be a vertical or a lateral GAA-FET device.

Although the GAA-FET device is a promising solution for future technology nodes including and smaller than N5 technology in semiconductor industry, the manufacture of this new device option poses several challenges. GAA-FET devices based on lateral nanowires have challenges associated with processing, which has an influence on the scalability of the transistor. Defining uniform gate and obtaining small channel lengths out of relatively long nanowires may be challenging.

In this respect, GAA-FET devices based on vertical nanowires may be better candidates since they can be fabricated using conventional CMOS techniques. However, the requirements imposed by GAA-FET devices, which are based on vertical nanowires, to be used for N5 technology and smaller, may be challenges on their fabrication. The ideal critical dimension for vertical nanowires, for example, for N5 technology is 7-8 nm with the smallest pitch having a value of 20 nm. Besides, at least the middle section of the nanowire, which constitutes the channel, it is desirable to have a straight profile. This means that the width variation of the nanowire corresponding to the length of the channel should practically be zero. This is due to the fact that any variation in the channel length will impact the performance of the device, i.e. on the performance of a GAA-FET device made by using such vertical nanowires.

Non-lithographic methods such as vapor-liquid-solid (VLS) mechanism and molecular beam epitaxy (MBE) can produce thin pillar structures, which are advantageous for fabricating devices as feature sizes are shrinking. However, assembling these thin pillar structures for the fabrication of the devices is difficult. Lithographic methods that include patterning and etching, on the other hand, cannot produce thin vertical pillar structures with good yield. Therefore, most proposed vertical transistor structures utilize thick pillars, thus also posing a challenge on the fabrication devices as feature sizes are shrinking.

Yang et al. ("Vertical Silicon-Nanowire Formation and Gate-All-Around MOSFET", IEEE Electron device Letters, vol. 29, No. 7, pp. 791, 2008) has disclosed a lithographic method for producing pillar structures on bulk silicon wafer that are thin and vertical and are suitable for fabricating a vertical gate-all-around silicon nanowire transistor by using a CMOS compatible technology.

However, this solution also relies on the formation of vertical pillar structures that are thick, which are further converted into thin pillar structures by making use of oxidization of the pillar followed by etching the oxidized outer region.

There is, therefore, a need in the art for lithographic methods including patterning and etching that enable the production of semiconductor pillar structures that are thin (e.g. having a width thinner than 60 nm or having a width thinner than 20 nm) and vertical such that these pillar structures are, further on, suitable for fabricating vertical gate-all-around nanowire field effect transistors.

SUMMARY

It is an object of the present disclosure to provide methods for producing pillar structures in a semiconductor layer.

The methods disclosed herein may allow for implementing patterning and etching techniques to produce pillar structures in a semiconductor layer.

Additionally, the dry plasma etch process used for removing the semiconductor layer, to thereby produce the pillar structure, includes splitting two parts of the semiconductor layer. This splitting removes a first part of the semiconductor layer, thus producing a first part of the pillar structure, and removes a second part of the semiconductor layer, thus producing a second part of the pillar structure. This splitting may improve the critical dimension (CD) uniformity of the pillar structure when a plurality of pillar structures is to be formed. This may be achieved by enhancing the selectivity towards the hard mask layer stack. Achieving CD uniformity of a plurality of pillar structures is important as feature sizes decrease, and therefore this method may help to increase the yield in the manufacturing fab.

Additionally, the methods disclosed herein may allow for improving the CD uniformity of the pillar structure when a plurality of pillar structures are to be formed, and for achieving reduced footing in the second part of the pillar structure.

The methods also allow for improving the CD uniformity of the pillar structure when a plurality of pillar structures are to be formed, and for achieving reduced footing in the second part of the pillar structure using patterning and etching techniques.

The method further allows for fabricating a vertical gate-all-around nanowire field effect transistor including the pillar structure produced according to embodiments of the present disclosure.

Furthermore, the vertical gate-all-around nanowire field effect transistors including the pillar structures produced according to embodiments of the present disclosure may have a channel region with improved CD uniformity.

The above objective is accomplished by a method according to the present disclosure.

In a first aspect, the present disclosure relates to a method for producing a pillar structure in a semiconductor layer. The method includes providing a structure having a semiconductor layer on a main surface. On the semiconductor layer, a patterned hard mask layer stack is provided. The patterned hard mask layer stack includes a first layer in contact with the semiconductor layer and a second layer overlying and in contact with the first layer. The semiconductor layer is dry plasma etched using the patterned hard mask layer stack as a mask. The dry plasma etching of the semiconductor layer includes subjecting the structure to a first plasma. Subjecting the structure to the first plasma removes the first part of the semiconductor layer and at least a part of the second layer of the patterned hard mask layer stack while preserving the first layer of the patterned hard mask layer stack. Subjecting the structure to the first plasma, thereby, may produce a first part of the pillar structure. Thereafter, the structure may be subjected to a second plasma. Subjecting the structure to the second plasma may remove the second part of the semiconductor layer. Subjecting the structure to the second plasma, thereby, may produce a second part of the pillar structure. The height of the removed first part of the semiconductor layer is greater than the height of the removed second part of the semiconductor layer. In embodiments, the patterned hard mask layer stack may consist of a first layer in contact with the semiconductor layer and a second layer overlying and in contact with the first layer.

In embodiments, providing the patterned hard mask layer stack may include depositing the first layer overlying and in contact with the semiconductor layer. A second layer may be deposited overlying and in contact with the first layer. After performing a patterning process followed by transferring the pattern by performing an etch process, the patterned hard mask layer stack may be formed.

In embodiments, the patterning process may be a lithographic patterning process, whereby a photoresist layer is deposited on the hard mask layer stack and a patterned photoresist layer is formed. Thereafter the hard mask layer stack may be etched using the patterned photoresist layer as a mask.

In embodiments, the lithographic patterning process may be done by Deep Ultra Violet (DUV), Extreme Ultra Violet (EUV), immersion lithography process or any one of multiple patterning processes such as self-aligned double patterning (SADP) or self-aligned quadrupole patterning (SAQP).

In alternative embodiments, the patterning process may be a non-lithographic patterning process. The non-lithographic patterning process may be a Directed Self Assembly (DSA) process. In embodiments, providing the patterned hard mask layer stack may further comprise depositing an antireflective coating layer sandwiched between the photoresist layer and the second layer of the hard mask layer stack in order to improve the patterning of the hard mask layer stack. The antireflective coating layer may be an antireflective coating layer stack. The antireflective coating layer stack may comprise a bottom antireflective coating layer (BARC) and a dielectric antireflective coating layer (DARC). BARC layer may be provided on and in contact with the DARC layer.

In embodiments, the semiconductor layer may include at least one element selected from the group including Si and Ge. In an embodiment, the semiconductor layer may include Si, Ge, or $Si_xGe_{1-x}$, where $0<x<1$. It is an attribute of the present disclosure that the semiconductor layer may include at least one element selected from Si and Ge. It is another attribute that the semiconductor layer includes Si, Ge, or $Si_xGe_{1-x}$, where $0<x<1$, due to the fact that, independently of whether the semiconductor layer includes Si, Ge, or $Si_xGe_{1-x}$, the method may enable the formation of pillar structures that can be used for fabricating gate-all-around nanowire field effect transistors. This in turn may help to contribute to the scaling of feature sizes where the performance of the device may be improved.

In embodiments, the semiconductor layer may be epitaxially grown. Growing the semiconductor layer epitaxially may provide freedom to choose the semiconductor layer to be used, such as, for example, Si, Ge or $Si_xGe_{1-x}$, where $0<x<1$. Furthermore, an epitaxial growth process may make it possible to tune the doping concentration in case the epitaxially grown semiconductor layer should be doped. Doping of the semiconductor layer can be done in-situ with the growth.

In embodiments, the first layer of the patterned hard mask layer stack may be a dielectric layer and the second layer of the patterned hard mask layer stack may be an organic layer.

In embodiments, the dielectric layer may be a silicon nitride or a silicon oxide. Such materials are frequently used as hard mask layers in semiconductor processing when dry plasma etching is used to transfer a defined pattern to the desired layers beneath them. In an example, the silicon nitride may be represented by $Si_xN_y$, where x=3 and y=4. In another example, the silicon nitride may be represented by $Si_3N_4$. In yet another example, the silicon oxide may be represented by $SiO_2$.

In embodiments, the organic layer may be an amorphous carbon layer.

In embodiments, the amorphous carbon layer may be an advanced patterning film (APF) layer. The APF layer may be deposited by Plasma Enhanced Chemical Vapor Deposition (PECVD), typically at a temperature in the range of 400° C. and 550° C. According to embodiments disclosed herein, APF may be used if there is no topography on the surface. In alternative embodiments, the amorphous carbon layer may be a spin on carbon (SoC) layer deposited by a spin coating process that typically involves using a suitable liquid solution in a lithography track. After spin coating, a bake step is typically performed at a temperature in the range of 200° C. to 250° C. According to some embodiments, the SoC layer deposited by spin-on-coating may be used if there is topography on the surface due to the fact that it has a self-planarizing effect. In embodiments, the amorphous carbon layer may be the APF layer since it is a denser layer than the SoC layer and it has higher etch selectivity than the SoC layer towards the dielectric layer.

In embodiments, the first plasma may be produced from a first etching gas. The first etching gas may include a carbon-comprising reactant and a first halogen-containing-containing reactant. The second plasma may be produced from a second etching gas. The second etching gas may comprise a second halogen-containing-containing reactant and an oxygen reactant.

It is an attribute of embodiments of the present disclosure to use the amorphous carbon layer as the organic layer, e.g., using APF or SoC layer as the second layer of the patterned hard mask layer stack. Without wishing to be bound by theory, this can be due to APF or SoC layer contributing to the amount of dissociation of the carbon-comprising reactant included in the first etching gas that is used to produce the first plasma.

Dissociation of the carbon-comprising reactant or recombination of the elements of the dissociation of the carbon-comprising reactant with elements of the dissociation of the first halogen-containing-containing reactant may lead to the formation of a polymer on the side wall of the part of the pillar structure produced. This polymer may help to preserve the side wall of the part of the pillar structure produced. This is due to the fact that the carbon-comprising reactant included in the first etching gas etches the semiconductor layer at a higher rate than it etches the polymer covering the sidewall of the part of the pillar structure produced when the structure is subjected to the first plasma.

In embodiments, the carbon-comprising reactant may be selected from a group including a hydrocarbon, a fluorocarbon and a hydrofluorocarbon. In embodiments, the hydrocarbon may be $CH_4$, $C_2H_4$, $C_3H_8$, or $C_2H_2$; the fluorocarbon may be $C_4F_8$, $C_4F_6$, $CF_4$, $C_2F_6$, $C_5F_8$, $C_3F_6$, $C_6F_6$, or $C_4F_8$; and the hydrofluorocarbon may be $CH_3F$, $CHF_3$, $C_2HF_5$, or $CH_2F_2$.

In some embodiments, the carbon-comprising reactant may be a hydrofluorocarbon. For example, the hydrofluorocarbon may be $CH_2F_2$.

In embodiments, the first halogen-containing-containing reactant may be selected from a group including $SF_6$, $NF_3$ and $CF_4$. In some embodiments, the first halogen-containing-containing reactant may be $SF_6$.

According to embodiments of the present disclosure, using $SF_6/CH_2F_2$ as the first etching gas to produce the first plasma leverages the advantage of achieving straight profile when etching the semiconductor layer to remove the first part of the semiconductor layer, which may lead to production of a first part of the pillar structure. Use of $CH_2F_2$ in the first etching gas may ensure further optimization or tuning of the profile of the produced first part of the pillar structure.

In embodiments, the second halogen-containing-containing reactant may be selected from a group consisting of HBr and $Cl_2$. In some embodiments, the second halogen-containing-containing reactant may be HBr. In embodiments, the oxygen reactant may be selected from a group including $O_2$, $CO_2$, $SO_2$ CO, $N_2O$ and $NO_2$. It is an attribute of the present disclosure, to use, HBr or $O_2$ as the second etching gas to produce the second plasma since it provides less footing at the bottom of the produced pillar structure. Another attribute of using $O_2$ gas in combination with HBr is that $O_2$ controls the sidewall passivation during etching into the semiconductor layer with HBr.

In embodiments, the dry plasma etching may further include, in between the first plasma and the second plasma, performing a strip process. The strip process may remove any remainder of the second layer of the patterned hard mask layer stack and/or any passivating film that may be formed and deposited on the structure after the completion of subjecting the structure to the first plasma. In the absence of the strip process, the profile of the produced pillar structure may be at jeopardy after the completion of subjecting the structure to the second plasma.

In embodiments, the strip process may be a plasma strip process and performing the strip process includes exposing the structure to a third plasma produced from a gas selected from a group consisting of oxygen gas, hydrogen gas and forming gas.

It is an attribute of the present disclosure to use the gas selected from the group including oxygen gas, hydrogen gas and forming gas due to the fact that these gases may be effective in removing polymeric residues from semiconductor layers. In some embodiments, the strip process may include exposing the structure to oxygen gas. The oxygen gas is $O_2$.

In other embodiments, the strip process may be an in-situ strip process. It is an attribute of the present disclosure to perform an in-situ strip process such that the vacuum used when subjecting the structure to the first plasma may be maintained. In yet other embodiments, the strip process may be an ex-situ strip process. The strip process may be performed ex-situ in case it is crucial to analyze the structure after it has been subjected to the first plasma. Following the ex-situ strip process, a breakthrough step may be performed before subjecting the structure to the second plasma. In embodiments, the breakthrough step and subjecting the structure to the second plasma may take place in the same process chamber. The breakthrough step may be performed before subjecting the structure to the second plasma since it may help to remove the native oxide that may have formed on the second part (32) of the semiconductor layer or on the produced first part of the pillar structure.

In embodiments, the semiconductor layer may be a semiconductor layer stack. The semiconductor layer stack may include a first layer having a first fraction of the thickness of the semiconductor layer stack. Overlying and in contact with the first layer, there may be a second layer having a second fraction of the thickness of the semiconductor layer stack. Overlying and in contact with the second layer, there may be a third layer having a third fraction of the thickness of the semiconductor layer stack. The second layer and the third layer of the semiconductor layer stack may form the first part of the semiconductor layer stack.

In embodiments, all the layers of the semiconductor layer stack may be of the same semiconductor material. In alternative embodiments, one or more of the layers of the semiconductor layer stack may be of a different semiconductor material. In embodiments, all the layers of the semiconductor layer stack may be doped with a dopant element. Doping all the layers of the semiconductor layer stack with a dopant element may help avoid performing an implantation process after the production of the pillar structure. Performing an implantation process after the production of the pillar structure may result in non-uniform doping profiles of the pillar structure due to shadowing effects, which is undesirable. Furthermore, an anneal process may be performed in order to at least activate 80 to 90% of the dopant element that usually requires high temperatures such as at least 600° C., which is dependent on the dopant dose implanted.

The dopant element may be, for example, an n-type dopant such as phosphorus or arsenic. Having a semiconductor layer stack with all its layers doped with such dopant elements for applications where the produced pillar structure may be used for fabricating an n-type device. The dopant element may also be, for example, a p-type dopant such as boron. It is advantageous to have a semiconductor layer stack with all its layers doped with such dopant elements for applications where the produced pillar structure may be used for fabricating a p-type device.

In embodiments, the second layer of the semiconductor layer stack may have a dopant concentration lower than that of the first layer and that of the third layer. In some embodiments, the dopant concentration of the second layer may be in the range of $1 \times 10^{15}$-$5 \times 10^{19}/cm^3$. In other embodiments, the dopant concentration of the second layer may be in the range of $5 \times 10^{18}$-$3 \times 10^{19}/cm^3$.

In embodiments, the dopant concentration of the first and third layer may be at least $1 \times 10^{20}/cm^3$. In other embodiments, the dopant concentration of the first and third layer may be in the range of $1 \times 10^{20}$-$1 \times 10^{21}/cm^3$.

In embodiments, the present disclosure relates to a method for fabricating a vertical gate-all-around nanowire field effect transistor. The method includes producing the pillar structure in the semiconductor layer according to any embodiments of the present disclosure where the semiconductor layer is a semiconductor layer stack. A gate stack is formed surrounding, on all sides, a part of the second layer of the semiconductor layer stack contained in the first part of the pillar structure.

In embodiments, the part of the second layer of the semiconductor layer stack contained in the first part of the pillar structure of the vertical gate-all-around nanowire field effect transistor may be a channel.

In embodiments, the first layer of the semiconductor layer stack contained in the first part of the pillar structure of the vertical gate-all-around nanowire field effect transistor may be a source or a drain region. Thus, having heavy doping concentration in the first layer of the semiconductor layer stack in the range of $1\times10^{20}$-$1\times10^{21}$/cm$^3$ when a contact is to be made to the source region or the drain region results in reduced contact resistance. Reduced contact resistance leads to a reduction in series resistance of the vertical gate-all-around nanowire field effect transistor.

BRIEF DESCRIPTION OF THE FIGURES

For the purpose of teaching, drawings are added. These drawings illustrate some aspects and embodiments of the disclosure. They are only schematic and non-limiting. The size of some of the elements may be exaggerated and not drawn on scale for illustrative purposes. The dimensions and the relative dimensions do not correspond to actual reductions to practice of the disclosure. Like features are given the same reference number.

FIG. 1, FIG. 2a, and FIG. 2b show flowcharts for producing a pillar structure, according to exemplary embodiments of the present invention.

FIG. 3a, FIG. 3b, FIG. 3c, FIG. 3d, and FIG. 3e show the influence of a trimming process on the produced pillar structure, according to an exemplary embodiment.

FIG. 4a, FIG. 4b, and FIG. 4c show schematically adapting the thickness of the organic layer, according to an exemplary embodiment.

FIG. 6a, FIG. 6b, FIG. 6c, FIG. 6d, FIG. 6e, FIG. 6f, and FIG. 6g show schematically the production of the pillar structure, according to another exemplary embodiment.

FIG. 7 shows schematically a vertical gate-all-around nanowire field effect transistor produced, according to an exemplary embodiment.

DETAILED DESCRIPTION

Figure 2:
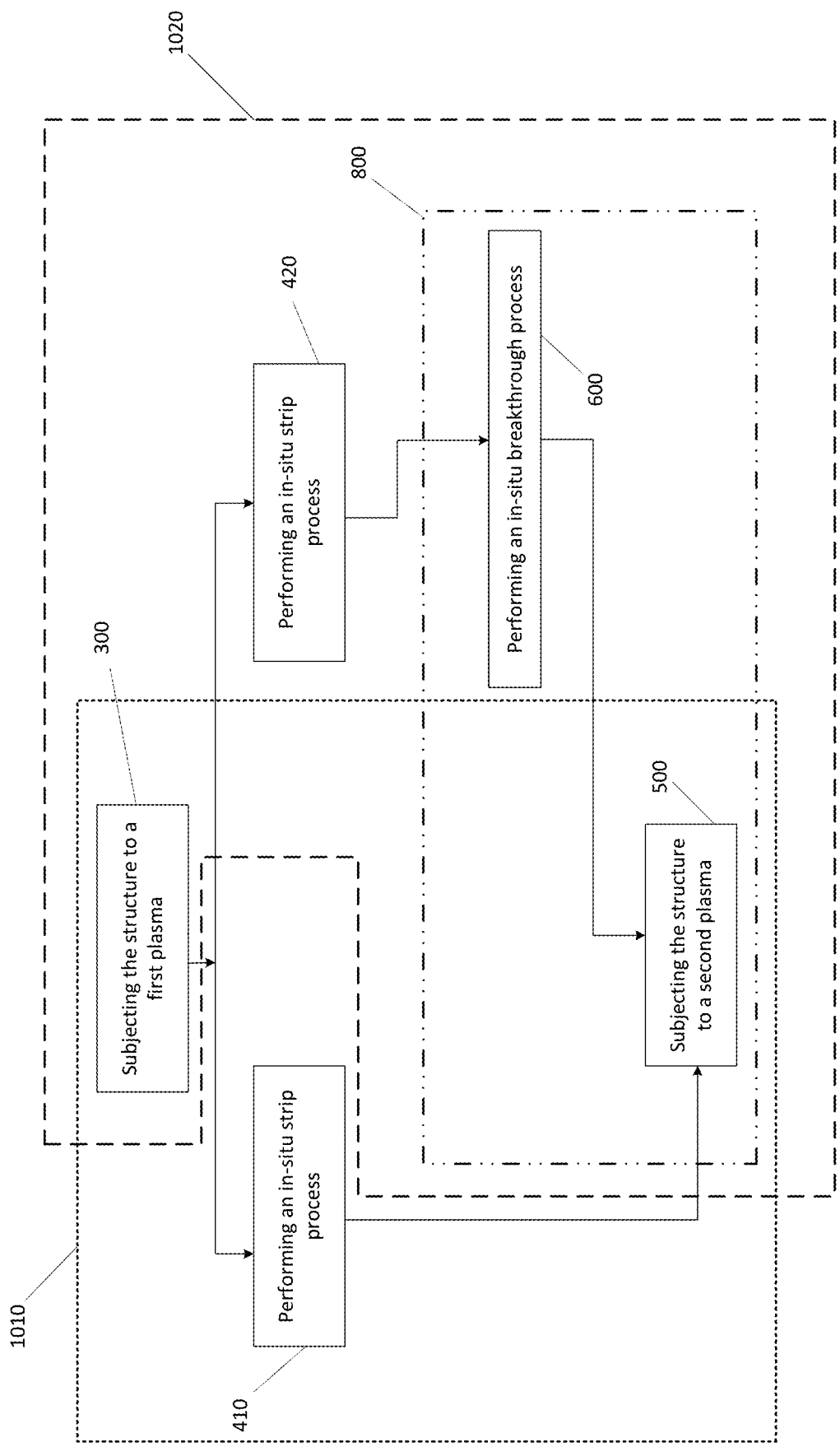

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout the specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout the specification are not necessarily all referring to the same embodiment, but may. Furthermore, the particular features, structures or characteristics may be combined in any suitable manner, as would be apparent to one of ordinary skill in the art from the disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various aspects of the disclosure. The method of disclosure, however, is not to be interpreted as reflecting an intention that the present disclosure requires more features than are expressly recited in each claim. Rather, as the following claims reflect, aspects lie in less than all features of a single foregoing disclosed embodiment. Thus, the claims following the detailed description are hereby expressly incorporated into the detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth.

However, it is understood that embodiments of the disclosure may be practiced without these specific details. In other instances, well-known methods, structures and techniques have not been shown in detail in order not to obscure an understanding of the description.

The following terms are provided solely to aid in the understanding of the disclosure.

As used herein and unless provided otherwise, the term "pillar structure" refers to a vertical structure protruding from a surface. As used herein and unless provided otherwise, the term "hydrocarbon" refers to compounds comprising carbon and hydrogen. In an embodiment, they may be represented by the formula $C_xH_z$, where $z=2x$, $z=2x-2$ or $z=2x+2$. For example, the hydrocarbon may be selected from the group including $CH_4$, $C_2H_4$, $C_3H_8$, $C_2H_2$ and mixtures thereof.

As used herein and unless provided otherwise, the term "fluorocarbon" refers to compounds including carbon and fluorine. In an embodiment, they may be represented by the formula $C_xF_z$, where $z=2x$ or $z=2x-2$. For example, the fluorocarbon may be selected from the group including of $C_4F_8$, $C_4F_6$, $CF_4$, $C_2F_6$, $C_5F_8$, $C_3F_6$, $C_6F_6$ and mixtures thereof. As used herein and unless provided otherwise, the term "hydrofluorocarbon" refers to compounds including carbon, hydrogen and fluorine. For example, the hydrofluorocarbon may be selected from the group including $CH_3F$, $CHF_3$, $C_2HF_5$, $CH_2F_2$ and mixtures thereof.

As used herein and unless provided otherwise, the term "oxygen reactant" refers to a gas molecule comprising at least one oxygen atom. The oxygen reactant may be chosen from group consisting of $O_2$, $CO_2$, $SO_2$, $CO$, $N_2O$, and $NO_2$. In an embodiment, the oxygen reactant comprises or is $O_2$.

As used herein and unless provided otherwise, the term "halogen-containing-containing reactant" refers to compounds comprising at least one halogen-containing. The halogen-containing reactant may be selected from $SF_6$, $NF_3$, $CF_4$, $Cl_2$ and HBr.

As used herein and unless provided otherwise, the term "in-situ" refers to a process that is carried out without having to change the process tool in question. Thus, the term "in-situ" refers to a process that is carried out in one and the same process tool as that of the preceding process.

As used herein and unless provided otherwise, the term "ex-situ" refers to a process that is carried out in a different process tool than the one in question.

As used herein and unless provided otherwise, the term "footing" refers to an increase in the width or the diameter of the pillar structure along the y-axis when extending from its top surface to its bottom surface.

As used herein and unless provided otherwise, the term "CD" refers to the width of the pillar structure.

As used herein and unless provided otherwise, the term "pitch" refers to the summation of the width of a feature or structure and the distance between two neighboring features/structures.

As used herein and unless provided otherwise, the term "pattern density" refers to the ratio of the open area over the unit area. An open area refers to the area not occupied by the pillar structures within a unit area of the semiconductor layer, where the unit area is an arbitrary area on the surface of the semiconductor layer.

As used herein and unless provided otherwise, the term "sccm" stands for standard cubic centimeter and is used to indicate flowrate. We now refer to FIG. 1 and FIG. 5. FIG. 1 and FIG. 2(a) show flowcharts for producing a pillar structure in a semiconductor layer according to an embodiment of the present invention. Such a pillar structure is a vertical pillar structure.

The method (800, 810) starts with (100) providing a structure comprising a semiconductor layer (30). In one embodiment, the structure may be a semiconductor structure. The semiconductor structure may be suitable for fabricating semiconductor devices. The semiconductor layer (30) comprises at least one element selected from the group consisting of Si and Ge. Preferably, the semiconductor layer (30) consists of Si, Ge or $Si_xGe_{1-x}$, wherein $0<X<1$. The semiconductor layer (30) has a relatively small number of defects, such as dislocations, as usually used in semiconductor industry.

A patterned hard mask layer stack (5) is provided (200) on the semiconductor layer (30). The patterned hard mask layer stack (5) includes a first layer (20) in contact with the semiconductor layer (30) and a second layer (10) overlying and in contact with the first layer (20). See FIG. 5 (c).

Figure 5B:
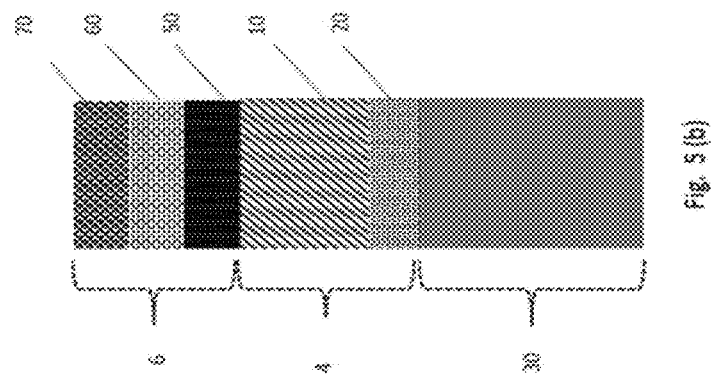
FIG. 5a, FIG. 5b, FIG. 5c, FIG. 5d, FIG. 5e, FIG. 5f, and FIG. 5g show schematically the production of the pillar structure, according to an exemplary embodiment.
Figure 5A:
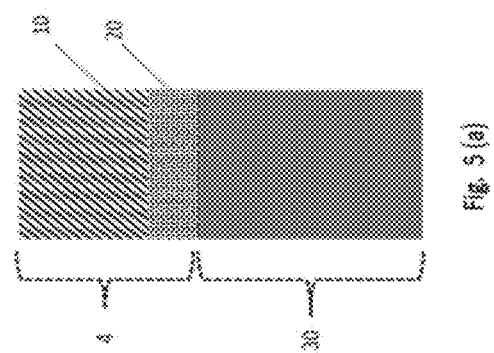
Figure 5:
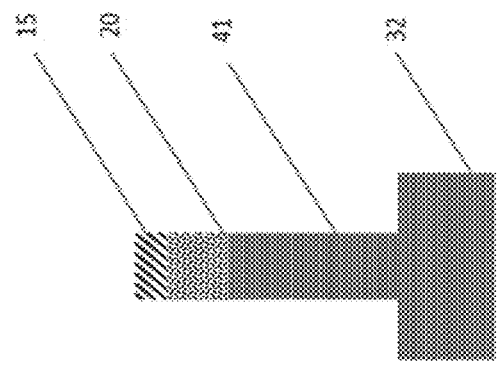
Figure 5:
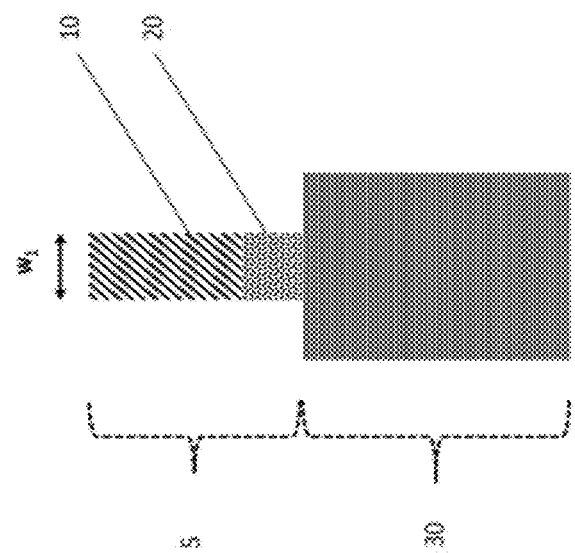

We now refer to FIG. 1 and FIG. 5 (d). The semiconductor layer (30) is dry plasma etched (1000) using the patterned hard mask layer stack (5) as a mask. The dry plasma etching (1000) of the semiconductor layer (30) includes subjecting the structure to a first plasma (300). When the structure is subjected to the first plasma, a first part of the semiconductor layer (30) is removed. As a result of subjecting the structure to the first plasma, a first part (41) of the pillar structure (40) is produced.

In embodiments, the semiconductor layer (30) may have a thickness in the range of 20 nm to 200 nm, preferably in the range of 30 to 120 nm, and more preferably, in the range of 40 to 80 nm.

The thickness of the semiconductor layer (30) may be chosen according to the technology node.

In embodiments, at least a part of the second layer (10) of the patterned hard mask layer stack (5) may be removed when the structure is subjected to the first plasma (300) while preserving the first layer (20) of the patterned hard mask layer stack (5).

Figure 5E:
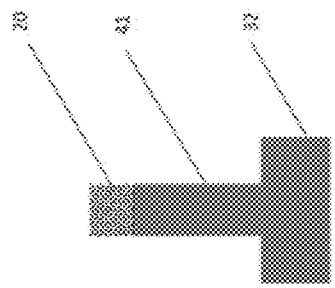
Figure 5F:
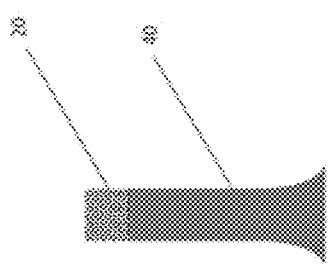
Figure 5G:
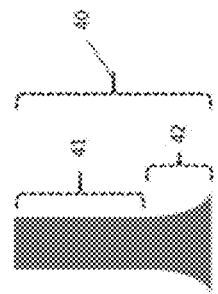

In other embodiments, the second layer (10) of the patterned hard mask layer stack (5) may be completely consumed as a result of subjecting the structure to the first plasma (300). This is represented in FIG. 5(e).

We now refer to FIG. 1 and FIGS. 5 (f) and (g). Thereafter, the structure may be subjected to a second plasma (500). Subjecting the structure to the second plasma (500) may remove a second part (32) of the semiconductor layer (30). As a result of subjecting the structure to the second plasma, a second part (42) of the pillar structure (40) may be produced. A time of exposure of the structure to the second plasma is adapted such that the height of the removed first part of the semiconductor layer (30) may still remain greater than the height of the removed second part of the semiconductor layer (30).

The inventors have found out that the method according to embodiments of the present disclosure may enable the production of a pillar structure from a semiconductor layer (30) by using patterning and etching techniques. Enabling the production of pillar structures using patterning and etching techniques may allow for achieving small CD pillar structures, such as for example 20 nm or less. Furthermore, it may allow for obtaining pillar structures with pitch value of about 20 nm. Additionally, splitting the dry plasma etch process (1000) by subjecting the semiconductor structure to the first plasma (300) and thereafter to the second plasma (500) may improve the CD uniformity of the pillar structure when a plurality of pillar structures are to be formed.

In embodiments, the first plasma may be produced from a first etching gas including a carbon-comprising reactant and a first halogen-containing reactant.

In embodiments, the carbon-comprising reactant may be selected from a group including a hydrocarbon, a fluorocarbon or a hydrofluorocarbon. In an embodiment, the carbon-comprising reactant may be a hydrofluorocarbon. For example, the hydrofluorocarbon may be $CH_2F_2$.

In embodiments, the first halogen-containing reactant may be selected from a group consisting of $SF_6$, $NF_3$ and $CF_4$.

In an embodiment, the first halogen-containing reactant may be $SF_6$.

In embodiments, subjecting the structure to the first plasma (300) may be carried out at a pressure in the range of 3 to 10 mT. In embodiments, the first plasma may be generated at a power from 300 to 700 Watts. In embodiments, subjecting the structure to the first plasma (300) may last from 60 to 80 seconds. In embodiments, the temperature of the process chamber during subjecting the structure to the first plasma (300) may be from 20° C. to 80° C. In embodiments, the carbon-comprising reactant and first halogen-containing reactant may be provided at a flow rate from 10 sccm to 50 sccm. In embodiments, a bias may be applied to the structure while subjecting the structure to the first plasma (300). The applied bias may be in the range of 50 V to 200 V. In embodiments, the first etching gas may be provided into the process chamber by the use of an inert carrier gas. For example, this inert carrier gas may be $N_2$.

In embodiments, the first etching gas may be provided into the process chamber together with a noble gas. This may dilute the first etching gas if needed and thus, may enhance gas dissociation. Thus, the flowrate of the noble gas may be adjusted according to the percent dilution desired. For example, this noble gas may be He.

In some embodiments, the semiconductor layer may for instance, be a Si substrate and the first plasma may be produced from a first etching gas comprising $CH_2F_2$, as the carbon-comprising reactant, and $SF_6$, as the first halogen-containing reactant.

The process parameters with respect to subjecting the structure to the first plasma (300) may be adapted according to the thickness of first part of the semiconductor layer (30) to be removed; thus according to the height of the first part (41) of the pillar structure to be produced. Furthermore, the flow rate of the carbon-comprising reactant may be adapted in order to ensure a better control on the profile of the first part of the pillar structure (41) produced. Subjecting the structure to the first plasma (300) may remove the first part of the semiconductor layer by etching the semiconductor layer (30).

In embodiments, the second plasma may be produced from a second etching gas including a second halogen-containing reactant and an oxygen reactant. In embodiments, the second halogen-containing reactant may be selected from a group consisting of HBr, and $Cl_2$. For example, the second halogen-containing reactant may be HBr.

In embodiments, the oxygen reactant may be selected from a group consisting of $O_2$, $CO_2$, $SO_2$, CO, $N_2O$ and $NO_2$.

In preferred embodiments, the oxygen reactant may be $O_2$.

In embodiments, subjecting the structure to the second plasma (500) may be carried out at a pressure in the range of 3 to 70 mT. In embodiments, the second plasma may be generated at a power from 300 to 1500 Watts. In embodiments, subjecting the structure to the second plasma may last from 40 to 120 seconds. In embodiments, the temperature of the process chamber during subjecting the structure to the second plasma (500) may be from 80° C. to 120° C.

In embodiments, the second halogen-containing reactant and oxygen reactant may be provided at a flow rate from 100 sccm to 500 sccm and from 1 sccm to 10 sccm, respectively.

In embodiments, a bias may be applied to the structure while subjecting the structure to the second plasma. The applied bias may be in the range of 50 V to 450 V.

In the context of the present disclosure, when an etching gas (e.g. a first etching gas), which is a combination of different component gases (e.g. a first etching gas including a carbon-comprising reactant and a first halogen-containing reactant), is used to produce a plasma (e.g. a first plasma), each component may be delivered to the process chamber through a separate gas line and each may have a separate flow. The different component gases may get mixed inside the process chamber. The dry plasma etching (1000) may be carried out in a dry plasma etching tool. The dry plasma etching tool may, preferably, be a Thermally Coupled Plasma (TCP) tool. A TCP reactor is a type of a reactor that can provide high density plasma and is typically used for etching conductor or semiconductor materials. Process parameters of the dry plasma etching (1000) of the semiconductor layer (30) may be adapted depending on the pattern density, the desired width (CD) and aspect ratio of the pillar structures to be produced. Accordingly, the dry plasma etching (1000) of the semiconductor layer may further include subjecting the structure, for a number of repeated times, to the first plasma before subjecting the structure to the second plasma. The pattern density, width and aspect ratio of the produced pillar structures are determined by the technology node required and may be influenced by the mask design. The width or in other words the CD of the pillar structure may be in the range of 7 nm to 60 nm. The aspect ratio of the pillar structure is at most 16.

In embodiments, the dry plasma etching process (1000) may further include a strip process (400). This may be shown by the flowchart schematically represented in FIG. 2 (a).

In embodiments, the strip process (400) may be a plasma strip process (400). Performing the strip process (400) may include exposing the structure to a third plasma. The third plasma may be produced from a gas selected from a group consisting of an oxygen gas, a hydrogen gas and a forming gas.

In embodiments, the oxygen gas may be $O_2$ gas. In embodiments, the hydrogen gas may be $H_2$ gas. In embodiments, the forming gas may be $N_2/H_2$ gas.

In preferred embodiments, the third plasma may be produced from $O_2$ gas.

In embodiments, performing the strip process (400) may be carried out at a pressure in the range of 10 to 20 mT.

In embodiments, the third plasma may be generated at a power from 800 W to 1200 W.

In embodiments, subjecting the structure to the third plasma may last from 30 to 120 seconds.

In embodiments, the temperature of the process chamber during the strip process may be from 40° C. to 80° C.

In embodiments, the flow rate of the gas provided during the strip process may be from 200 sccm to 900 sccm.

In embodiments, a bias may be applied to the structure during the strip process. The bias may be in the range of 50 V to 150 V. FIG. 2 (b) is a flowchart presenting the strip process (400).

In an embodiment, the strip process (400) may be an in-situ strip process (410). This results in dry plasma etching (1010) the semiconductor layer (1010) by subjecting the structure to the first plasma (300), followed by performing the in-situ strip process (410) and thereafter subjecting the structure to the second plasma (500) in the same process chamber and without vacuum break.

In an alternative embodiment, the strip process (400) may be an ex-situ strip process (420). This may result in dry plasma etching the semiconductor layer (1020) by subjecting the structure to the first plasma (300) in the process chamber. The ex-situ strip process (420) may be performed in another process chamber suitable for performing a strip process. The dry plasma etching process (1020) may further include an in-situ breakthrough process (600) preceding the subjecting of the structure to the second plasma (500) in the process chamber. Performing the breakthrough step (600) preceding the subjecting of the structure to the second plasma (500) may help remove the native oxide that may have formed on the second part (32) of the semiconductor layer or on the produced first part (41) of the pillar structure (40). Performing the in-situ breakthrough step (600) may include exposing the structure to a fourth plasma. The fourth plasma may be produced from a gas including an oxygen gas, a noble gas and a fluorocarbon gas.

In embodiments, the oxygen gas may be $O_2$.

In embodiments, the noble gas may be He. He is used for diluting the gas mixture. He may further enhance the plasma dissociation. In embodiments, the fluorocarbon gas may be $CF_4$.

In embodiments, performing the in-situ breakthrough process (600) may be carried out at a pressure in the range of 3 mT to 10 mT.

In embodiments, the fourth plasma may be generated at a power from 100 W to 300 W.

In embodiments, subjecting the structure to the fourth plasma during the in-situ breakthrough may last from 2 seconds to 10 seconds.

In embodiments, the temperature of the process chamber during the in-situ breakthrough process may be from 30° C. to 90° C.

In embodiments, the flow rate of the $O_2$ provided during the in-situ breakthrough process may be from 5 sccm to 50 sccm.

In embodiments, the flow rate of the $CF_4$ provided during the in-situ breakthrough process may be from 10 sccm to 100 sccm.

In embodiments, the flow rate of the He provided during the in-situ breakthrough process may be from 10 sccm to 100 sccm.

In embodiments, a bias may be applied to the structure when subjecting it to the fourth plasma during the in-situ breakthrough. The bias may be in the range of 100 V to 500 V.

In embodiments, the first layer (20) of the patterned hard mask layer stack (5) may be a dielectric layer. The dielectric layer may be a silicon nitride or a silicon oxide. In embodiments, the dielectric layer may be a $Si_3N_4$ or $SiO_2$. Yet, in other embodiments, the dielectric layer may be $SiO_2$. The dielectric layer may serve as a hard mask during subjecting the structure to the second plasma (500).

In embodiments, the second layer (10) of the patterned hard mask layer stack (5) may be an organic layer. The organic layer may be an amorphous carbon layer such as an advanced patterning film (APF) layer or a SoC layer. The carbon-containing layer (10), overlying and in contact with dielectric layer (20) of the patterned hard mask layer stack (5), may have an adapted thickness.

In embodiments, the adapted thickness is such that a height of the removed first part of the semiconductor layer (30) as a result of subjecting the structure to the first plasma (300) is greater than a height of the removed second part of the semiconductor layer (30) as a result of subjecting the structure to the second plasma (500). The carbon-containing layer (10) having the adapted thickness is advantageous because it facilitates the production of a high aspect ratio pillar structure.

The dielectric layer (20) of the patterned hard mask stack (5) may not be selective to the carbon-comprising reactant included in the first etching gas used to produce the first plasma. Therefore, at the moment when the organic layer is consumed when the structure is subjected to the first plasma (300), the dielectric layer (20) may be etched and subsequently the produced first part (41) of the pillar structure (40) may start to erode. This may jeopardize the formation of a high aspect ratio pillar structure. This problem may be solved by depositing a thick layer of organic layer (10). However, as technology nodes in semiconductor manufacturing are going down, the required CD of the pillar structures will also go down. The width or in other words the CD of the pillar structure to be produced is in the range of 10 nm to 60 nm. Accordingly, the CD ($w_1$) of the patterned hard mask layer stack (5) may have to be reduced in order to produce pillar structures with the CD requirements within this given range. However, as the CD of the patterned hard mask layer stack (5) is reduced, the organic layer (10) may be consumed faster when the structure is subjected to the first plasma (300).

Reducing the CD of the patterned hard mask layer stack (5) can be achieved by performing a trimming process (not shown in the figures). The trimming process may help to reduce the CD of the features of the patterned hard mask layer stack (5). Additionally, trimming may be useful and advantageous when the target CD of the pillar structure to be produced is a reduced value in comparison to the one that can be defined and obtained by using the patterning technique in question. After patterning the photoresist layer (70), to thereby form patterned photoresist features (not shown in the figures), BARC layer (60) and DARC layer (50) may be etched using the patterned photoresist features as a mask. This may then be followed by carrying out the trim process in order to trim the CD of the DARC layer (50). Trimming process may be carried out by subjecting the structure to a plasma produced from a gas mixture comprising $CF_4$. During the trimming process it is aimed to protect the patterned photoresist feature. Therefore, $CHF_3$ gas may be introduced into the gas mixture.

FIG. 3 demonstrates an example of producing a Si pillar structure by subjecting a Si substrate to the first plasma (300) when the CD of the patterned hard mask layer stack (5) is reduced by performing the trimming process. As the process time for trimming is prolonged (shown as going from FIG. 3 (a) to FIG. 3 (e)), erosion of the pillar structure, illustrated in FIG. 3 (e), may be observed due to the fact that carbon-containing layer (10) is consumed. Without wishing to be bound by theory, this can be due to the increased surface area (SA) to volume (V) ratio (SA/V). This, in return, may lead to severe processing and integration issues for achieving pillar structures having aspect ratio in the range of 6 to 16. To overcome the problem associated with this increased SA/V ratio, the thickness of deposited organic layer (10) may be reduced. However, this then may result in the problem of eroding pillar structure.

The inventors have, thus, found out that adapting the thickness of the organic layer (10) may be desirable. Adapting the thickness of the organic layer (10) is illustrated in FIG. 4(a) to FIG. 4(c) and may include depositing the organic layer (10) at a first thickness ($T_0$) overlying and in contact with the dielectric layer (20), illustrated in FIG. 4(a), present overlying the semiconductor layer (30). The semiconductor layer (30) may have an initial thickness denoted by $H_0$. As illustrated in FIG. 4b, after performing a patterning and etch step, the patterned hard mask layer stack (5) may be produced on the semiconductor layer (30). The structure may be subjected to the first plasma (300) for a determined period of time (t), subsequently followed by measuring the height ($H_1$) of the pillar structure produced, and measuring the thickness ($T_2$) of the remaining organic layer (10) illustrated in FIG. 4(c). Such measurements may be carried by techniques known to persons skilled in the art such as, for example, cross section scanning electron microscopy (X-SEM), focused ion beam (FIB) or cross section FIB. Thereafter, the etch rate ($ER_{SL}$) of the semiconductor layer (30) may be calculated by using the following equation: (1)

$$ER_{SL}=(H_1)=(H_0-H_2)/t \qquad (1)$$

where $H_2$ is the thickness of the semiconductor layer (30) remaining.

Subsequently, the etch rate of the organic layer (10) may be calculated by using the following equation (2):

$$ER_{OL}=(T_0-T_2)/t=(T_1)/t \qquad (2)$$

Using the etch rate value ($ER_{SL}$) of the semiconductor layer (30), a desired etch time ($t_d$) required to produce the first part (41) of the pillar structure (40) having a desired height ($H_d$) may be calculated by using the following equation (3):

$$t_d=H_d ER_{SL} \qquad (3)$$

Thereafter, the adapted thickness of the organic layer ($T_{adapted}$) is calculated by using the desired etch time ($t_d$) and the etch rate of the organic layer ($ER_{OL}$) (10) using the following equation (4):

$$T_{adapted}=(ER_{OL})*t_d \qquad (4)$$

A test structure or a dummy structure may be used to calculate the adapted thickness of the organic layer (10).

Adapting the thickness of the organic layer (10) may have the advantage within the scope of the present disclosure that, the CD uniformity of the pillar structure (40) is improved in case a plurality of pillar structures are to be formed when the structure is subjected to the first plasma (300). The height of the first part (41) of the pillar structure (40) produced corresponds to the height of the removed first part of the semiconductor layer (30). By adapting the thickness of the organic layer (10) the height of the removed first part of the semiconductor layer (30) is greater than the height of the removed second part of the semiconductor layer (30). This is particularly advantageous when the produced pillar structure is used for fabricating a vertical gate-all-around nanowire field effect transistor. This is because the channel region will be within the produced first part (41) of the pillar structure (40) and thus, the channel region will have a small variation in CD. Having a small variation in CD throughout the channel region is advantageous since adverse effects on device performance is avoided. It is known to persons skilled in the art that variations in CD of the channel region of a field effect transistor may influence performance parameters such as for example sub-threshold slope (SS), drain induced barrier lowering (DIBL) and drain saturation current ($I_{Dsat}$).

In embodiments, the semiconductor layer may be a single layer consisting of Si, Ge or $Si_XGe_{1-X}$, wherein 0<X<1.

In embodiments, the single semiconductor layer may be a substrate. In this embodiment, the substrate may be a wafer.

In alternative embodiments, the single semiconductor layer (30) may be obtained by a process or a combination of processes such that it has relatively a small number of defects such as dislocations. One example of such a process may be an epitaxial growth process. The epitaxial growth process may optionally be followed by an anneal process to further limit the small number of defects in a lower part of the epitaxially grown semiconductor layer.

In embodiments, the single semiconductor layer may be un-doped.

In alternative embodiments, the single semiconductor layer may be doped with a dopant element. The doping profile of the dopant element may be gradual throughout the thickness of the single semiconductor layer. The doping profile of the dopant element may also be uniform throughout the thickness of the single semiconductor layer. The type of the dopant element and its concentration within the single semiconductor layer can be tuned to be suitable according to the application where the produced pillar structure will be used.

As can be seen in FIG. 5 (a) to (g), in embodiments of the preset invention, a pillar structure (40) may be produced, where the semiconductor layer (30) may be a single semiconductor layer.

Subsequent to providing, on the semiconductor layer (30), a hard mask layer stack (4) comprising the first layer (20), which is the dielectric layer (10), in contact with the semiconductor layer (30) and the second layer (10), which is the organic layer (10), overlying and in contact with the first layer (20) as illustrated in FIG. 5 (a), a patterning process and an etching process is performed to form the patterned hard mask layer stack (5) as illustrated in FIG. 5 (c).

In embodiments, the patterning process may be any one of a lithographic patterning process such as EUV, DUV, SADP, SAQP or immersion lithography. Performing the lithographic process may comprise providing a patterning layer overlying the hard mask layer stack (4). The patterning layer may be a patterning layer stack (6) including one or more layer of an antireflective coating and a photoresist on one or more layer of the antireflective coating.

In embodiments, the patterning layer stack (6) may include a dielectric antireflective coating (DARC) (50) layer overlying the hard mask layer stack (4). A bottom antireflective coating (BARC) (60) layer overlays the DARC layer (50). A photoresist (70) coats the BARC layer (60). The type and thickness of the BARC layer, DARC layer and the photoresist layer may be chosen according to the requirements of the lithographic process to be performed. Forming patterned features on the patterning layer stack using the lithographic process and performing an etching process using the patterned features of the patterning layer stack as a mask to thereby form the patterned hard mask layer stack (5) is known to persons skilled in the art.

In alternative embodiments, the patterning process may also be a non-lithographic patterning process such as DSA.

As illustrated in FIG. 5d, after subjecting the structure to the first plasma (300) a first part of the semiconductor layer is removed, thereby producing a first part (41) of the pillar structure (40) protruding from the second part (32) of the semiconductor layer (30). Performing the strip process (400) removes the polymerizing layer that may have accumulated on the sidewalls of the produced first part (41) of the pillar structure (40). In case there is a remaining of the organic layer (10) on the dielectric layer (20), the strip process removes this remaining, to thereby result in the first part (41) of the pillar structure (40) with the dielectric layer (20) on it, as illustrated in FIG. 5(e). Removal of the remaining organic layer from the structure is desirable, otherwise it may have adverse effects during subjecting the structure to the second plasma (500), such as profile distortion of the pillar structure (40).

After performing the strip process (400), the structure is subjected to the second plasma (500), whereby the dielectric layer (20) is used as a mask. Subjecting the structure to the second plasma (500) removes the second part (32) of the semiconductor layer (30) by etching to, thereby, produce the second part (42) of the pillar structure (40) illustrated in FIG. 5 (f). A strip process is performed following the subjecting of the structure to the second plasma to remove the remaining, if any, of the dielectric layer (20) as illustrated in FIG. 5 (g).

In embodiments, the height of the removed second part (32) of the semiconductor layer (30) is lower than the height of the removed first part of the semiconductor layer (30). This may be achieved by adapting the exposure time to which the structure is exposed during the second plasma.

In embodiments, the semiconductor layer (30) may be a semiconductor layer stack (31) consisting of more than one layer.

With reference to FIG. 6, in some embodiments, the semiconductor layer stack (31) includes a first layer (31''') having a first fraction of the thickness of the semiconductor layer stack (31). Overlying and in contact with the first layer (31'''), a second layer (31'') having a second fraction of the thickness of the semiconductor layer stack (31) may be present. Thereafter, overlying and in contact with the second layer (31''), a third layer (31') having a third fraction of the thickness of the semiconductor layer stack (31) may be present.

In embodiments, the semiconductor layer stack (31) may be obtained by epitaxially depositing the layers (31', 31'', 31'').

In embodiments, the semiconductor layer stack (31) may be un-doped.

In alternative embodiments, the layers of the semiconductor layer stack (31) may be doped with a dopant element. The doping profile of the dopant element may be gradual throughout the thickness of each of the layers. The doping profile of the dopant element may also be uniform throughout the thickness of each of the layers. The type of the dopant element and its concentration within each layer of the semiconductor layer stack (31) can be tuned according to the application where the produced pillar structure will be used.

In alternative embodiments, a pillar structure (40) may be produced, where the semiconductor layer (30) may be a semiconductor layer stack (31). FIG. 6 (a) to FIG. 6 (g) show schematically how the pillar structure is produced from a semiconductor layer stack (31). Subsequent to providing, on the semiconductor layer stack (31), a hard mask layer stack (4) comprising the first layer (20) and the second layer (10), (illustrated in FIG. 6 (a)), a patterning process and etching process is performed to form the patterned hard mask layer stack (5) illustrated in FIG. 6 (c).

In embodiments, the patterning process may be any one of a lithographic patterning process such as EUV, DUV, SADP, SAQP or immersion lithography. Performing the lithographic process may comprise providing a patterning layer overlying the hard mask layer stack (4).

In embodiments, the patterning layer may be a patterning layer stack (6) including one or more layer of an antireflective coating and a photoresist on one or more layer of the antireflective coating.

In embodiments, the patterning layer stack (6) may include a dielectric antireflective coating (DARC) (50) layer overlying the hard mask layer stack (4). A bottom antireflective coating (BARC) (60) layer overlays the DARC layer (50). A photoresist (70) coats the BARC layer (60). The type and thickness of the BARC layer, DARC layer and the photoresist layer may be chosen according to the requirements of the lithographic process to be performed. Forming patterned features on the patterning layer stack using the lithographic process and performing an etching process using the patterned features of the patterning layer stack (6) as a mask to thereby form the patterned hard mask layer stack (5) is known to persons skilled in the art.

In alternative embodiments, the patterning process may also be a non-lithographic patterning process such as DSA.

Figure 6B:
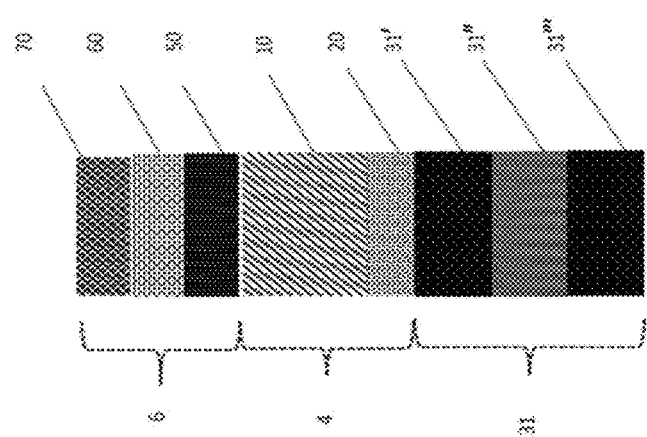
Figure 6A:
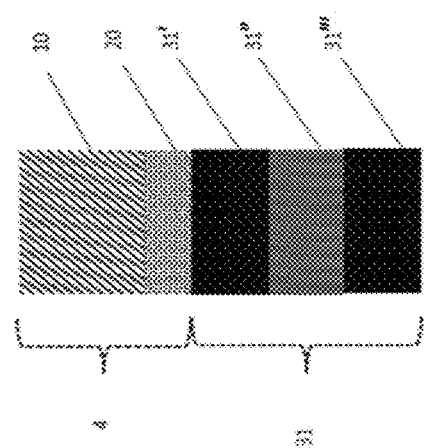
Figure 6D:
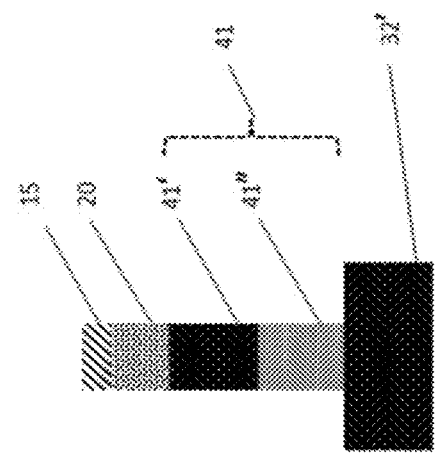
Figure 6C:
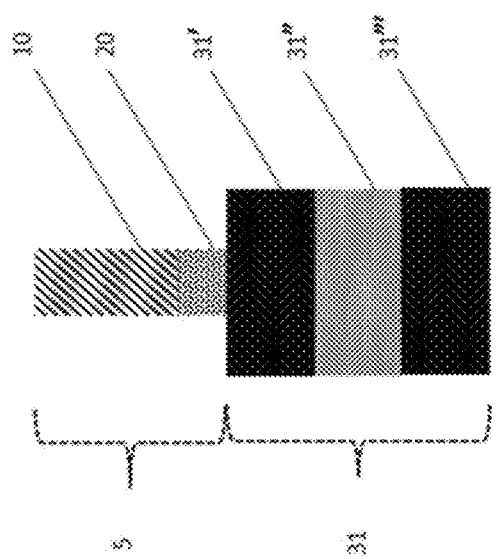

As illustrated in FIG. 6d, after subjecting the structure to the first plasma (300), a first part of the semiconductor layer is removed, thereby producing a first part (41) of the pillar structure (40) protruding from the second part (32') of the semiconductor layer stack (31). The first part (41) of the pillar structure (40) includes a part (41') of the third layer (31') and a part (41'') of the second layer (31'') of the semiconductor layer stack (31). Performing the strip process (400) removes the polymerizing layer that may have accumulated on the sidewalls of the produced first part (41) of the pillar structure (40). In case there is a remaining of the organic layer (10) on the dielectric layer (20), the strip process removes this remaining, to thereby result in the first part (41) of the pillar structure (40) with the dielectric layer (20) on it (illustrated in FIG. 6(e)). Removal of the remaining organic layer from the structure is desirable otherwise it may have adverse effects during subjecting the structure to the second plasma (500) such as profile distortion of the pillar structure (40).

After performing the strip process (400), the structure is subjected to the second plasma (500), whereby the dielectric layer is used as a mask. Subjecting the structure to the second plasma (500) removes the second part (32') of the semiconductor layer stack (31) by etching to, thereby, produce the second part (42) of the pillar structure (40), as illustrated in FIG. 6 (f). A strip process is performed following the subjecting of the structure to the second plasma to remove the remaining, if any, of the dielectric layer (20) (illustrated in FIG. 6 (g)).

In embodiments, the height of the removed second part (32') of the semiconductor layer stack (31) may be lower than the height of the removed first part of the semiconductor layer stack (31). This may be achieved by adapting the exposure time to which the structure is exposed during the second plasma.

FIG. 7 represents, schematically, a vertical gate-all-around nanowire field effect transistor (900) produced using the pillar structure (40) obtained, according to an embodiment. The vertical gate-all-around nanowire field effect transistor has a source region (1, 1') and a drain region (1', 1). The source region and the drain region is formed of the parts (41',42) of the pillar structure (40), that are produced by removing the first part and the second part of the semiconductor layer stack (31). A gate stack (4) is formed surrounding, on all sides, a part (41'') of the second layer (31'') of the semiconductor layer stack (31) contained in the first part (41) of the pillar structure (40). The part (41'') of the second layer (31'') of the semiconductor layer stack (31) contained in the first part (41) of the pillar structure (40) of the vertical gate-all-around nanowire field effect transistor forms a channel. The gate stack (4) may include a gate dielectric (3) surrounding on all sides the channel (41''). The gate stack (4) may further include a gate metal (2) surrounding on all sides the gate dielectric (3).

The invention claimed is:

1. A method for producing a pillar structure in a semiconductor layer, the method comprising:
    providing a structure comprising the semiconductor layer, wherein the semiconductor layer comprises a first part and a second part;
    providing on a surface of the semiconductor layer a patterned hard mask layer stack comprising a first layer in contact with the surface of the semiconductor layer and a second layer overlying and in contact with the first layer, wherein the first part of the semiconductor layer is between the first layer of the patterned hard mask layer stack and the second part of the semiconductor layer; and dry plasma etching the semiconductor layer by:
subjecting the structure to a first plasma while masking the semiconductor layer with the first layer and the second layer to remove a portion of the first part of the semiconductor layer and a part of the second layer while preserving the first layer, thereby producing a first part of the pillar structure; and
subjecting the structure to a second plasma to remove a portion of the second part of the semiconductor layer, thereby producing a second part of the pillar structure, wherein a first height of the portion of the first part of the semiconductor layer perpendicular to the surface is greater than a second height of the portion of the second part of the semiconductor layer perpendicular to the surface.

2. The method of claim 1, wherein the semiconductor layer comprises at least one element selected from a group comprising Si and Ge.

3. The method of claim 1, wherein the first layer is a dielectric layer and the second layer is an organic layer.

4. The method of claim 3, wherein the dielectric layer is at least one of: a silicon nitride or a silicon oxide.

5. The method of claim 1, wherein the first plasma is produced from a first etching gas comprising a carbon-comprising reactant and a first halogen-containing reactant, and wherein the second plasma is produced from a second etching gas comprising a second halogen-containing reactant and an oxygen reactant.

6. The method of claim 5, wherein the carbon-comprising reactant is selected from a group comprising a hydrocarbon, a fluorocarbon and a hydrofluorocarbon.

7. The method of claim 5, wherein the first halogen-containing reactant is selected from a group comprising $SF_6$, $NF_3$ and $CF_4$.

8. The method of claim 5, wherein the second halogen-containing reactant is selected from a group comprising HBr and $Cl_2$.

9. The method of claim 5, wherein the oxygen reactant is selected from a group comprising $O_2$, $CO_2$, $SO_2$, CO, $N_2O$ and $NO_2$.

10. The method of claim 1, wherein the dry plasma etching further comprises performing a strip process in between the first plasma and the second plasma.

11. The method of claim 10, wherein the strip process is a plasma strip process, and wherein performing the strip process comprises exposing the structure to a third plasma produced from a gas selected from a group comprising oxygen gas, hydrogen gas and forming gas.

12. The method of claim 10, wherein the strip process is an in-situ strip process.

13. The method of claim 10, wherein the strip process is an ex-situ strip process, and wherein the dry plasma etching further comprises an in-situ breakthrough process preceding the subjecting of the structure to the second plasma.

14. The method of claim 1, wherein the semiconductor layer comprises:
a first sublayer having a first fraction of a thickness of the semiconductor layer;
a second sublayer overlying and in contact with the first sublayer, the second sublayer having a second fraction of the thickness of the semiconductor layer; and
a third sublayer overlying and in contact with the second sublayer, the third sublayer having a third fraction of the thickness of the semiconductor layer, wherein the second sublayer and the third sublayer form the first part of the semiconductor layer.

15. The method of claim 14, wherein the first sublayer, the second sublayer, and the third sublayer are doped with a dopant element.

16. The method of claim 1,
wherein the pillar structure is a vertical structure including at least first and second sidewalls that protrude relative to an open area, the open area being an area on the surface of the semiconductor layer that is not occupied by one or more pillar structures,
wherein producing the first part of the pillar structure comprises producing a first part of the first sidewall of the pillar structure and a first part of the second sidewall of the pillar structure, and
wherein producing the second part of the pillar structure comprises producing a second part of the first sidewall of the pillar structure and a second part of the second sidewall of the pillar structure.

17. The method of claim 1, further comprising:
fabricating a gate-all-around field effect transistor (GAA-FET) including the pillar structure.

18. The method of claim 17, wherein fabricating the GAA-FET comprises:
forming a gate that surrounds, on all sides, a particular portion of the first part of the pillar structure, the particular portion being a channel region of the GAA-FET.

19. The method of claim 18, wherein fabricating the GAA-FET further comprises:
forming source and drain regions respectively using respective portions of the pillar structure other than the particular portion.

20. The method of claim 1, wherein producing the second part of the pillar structure comprises producing the second part of the pillar structure such that the second part of the pillar structure has a width that increases moving away from the surface of the semiconductor layer.

* * * * *